United States Patent [19]

Devaud

[11] 4,409,424
[45] Oct. 11, 1983

[54] COMPENSATED AMORPHOUS SILICON SOLAR CELL

[75] Inventor: Genevieve Devaud, 629 S. Humphrey Ave., Oak Park, Ill. 60304

[73] Assignee: The United States of America as represented by the U.S. Department of Energy, Washington, D.C.

[21] Appl. No.: 390,730

[22] Filed: Jun. 21, 1982

[51] Int. Cl.³ .............................................. H01L 31/06
[52] U.S. Cl. ....................................... 136/258; 357/2; 357/30; 357/59
[58] Field of Search ............. 136/258 AM; 357/2, 30, 357/59

[56] References Cited

U.S. PATENT DOCUMENTS 4,217,148  8/1980  Carlson ................................. 136/255
4,357,179  11/1982  Adams et al. ......................... 148/1.5

Primary Examiner—Aaron Weisstuch
Attorney, Agent, or Firm—John L. Isaac; Sandra B. Weiss; Richard G. Besha

[57] ABSTRACT

An amorphous silicon solar cell including an electrically conductive substrate, a layer of glow discharge deposited hydrogenated amorphous silicon over said substrate and having regions of differing conductivity with at least one region of intrinsic hydrogenated amorphous silicon. The layer of hydrogenated amorphous silicon has opposed first and second major surfaces where the first major surface contacts the electrically conductive substrate and an electrode for electrically contacting the second major surface. The intrinsic hydrogenated amorphous silicon region is deposited in a glow discharge with an atmosphere which includes not less than about 0.02 atom percent mono-atomic boron. An improved N.I.P. solar cell is disclosed using a $BF_3$ doped intrinsic layer.

21 Claims, 2 Drawing Figures

COMPENSATED AMORPHOUS SILICON SOLAR CELL

CONTRACTUAL ORIGIN OF THE INVENTION

The invention described herein was made in the course of, or under, a contract with the UNITED STATES DEPARTMENT OF ENERGY.

BACKGROUND OF THE INVENTION

Photovoltaic devices convert light into usable electrical energy due to what is known as the photovoltaic effect. Light absorbed by an active region of semi-conductor material generates electrons and holes which are separated by a built-in electric field in the photovoltaic device resulting in the generation of an electric current known as the photocurrent and a voltage known as the photovoltage. The generated electrons flow toward the region of semi-conductor material having N-type conductivity while the holes flow toward the region of semi-conductor material having P-type conductivity or a metal layer.

Basic types of hydrogenated amorphous silicon solar cells incorporating an intrinsic or undoped region are disclosed in U.S. Pat. No. 4,064,521, issued Dec. 20, 1977 to Carlson, the disclosure of which is incorporated herein by reference. The undoped hydrogenated amorphous silicon disclosed in the aforementioned U.S. Pat. No. 4,064,521 patent is slightly N-type when fabricated at an optimum substrate temperature from about 250° C. to about 350° C. The slightly N-type nature implies a donor-like defect in the intrinsic hydrogenated amorphous silicon region. The space charge region of the solar cell incorporating the aforementioned intrinsic layer could be increased if the region were not slightly N-type. Increasing the width of the space charge layer by incorporating a P-type dopant into the intrinsic amorphous silicon region is disclosed in U.S. Pat. No. 4,217,148, issued Aug. 12, 1980 to Carlson, the disclosure of which is incorporated herein by reference.

Carlson has attacked this problem by doping the intrinsic layer with diborane($B_2H_6$), wherein the diborane is present in the glow discharge atmosphere in an amount between about 0.00001 percent to about 0.003 atom percent of the glow discharge atmosphere. Carlson teaches that this doping level of diborane increases the width of the space charge layer, thereby reducing the space charge density under illumination to substantially neutral. However, a problem encountered with diborane doping in larger amounts is the reduction in the band gap as compared to intrinsic or undoped amorphous hydrogenated silicon. In addition, diborane doped material has inferior transport properties and a high density of defects, thus the combination of these two effects results in a significant loss of photogenerated carriers due to recombination in the P-layer for cells illuminated through the P-layer. Both of these effects can be ameliorated by using material doped with phosphine and illuminating through the N-layer. However, in order to use the N-layer as a window, it is necessary to modify the intrinsic layer without degrading its transport or absorption properties. The Carlson patent does not teach this important concept.

SUMMARY OF THE INVENTION

A principal object of the present invention is to provide a solar cell in which the intrinsic layer is doped to reduce the space charge density under illumination to about zero while at the same time maintaining the transport and absorption properties inherent in undoped intrinsic hydrogenated amorphous silicon.

Another object of the present invention is to provide an amorphous silicon solar cell comprising an electrically conductive substrate, a layer of glow discharge deposited hydrogenated amorphous silicon over said substrate and having regions of differing conductivity with at least one region of intrinsic hydrogenated amorphous silicon, the layer of hydrogenated amorphous silicon having opposed first and second major surfaces, wherein the first major surface contacts the electrical conductive substrate, and means for electrically contacting the second major surface, wherein the intrinsic hydrogenated amorphous silicon region is deposited from an atmosphere containing not less than about 0.02 atom percent mono-atomic boron.

Another object of the present invention is to provide an electrically conductive substrate, a layer of glow discharge deposited hydrogenated amorphous silicon over said substrate and having regions of N-type conductivity and P-type conductivity separated by a region of intrinsic hydrogenated amorphous silicon deposited from an atmosphere containing not less than about 0.02 atom percent mono-atomic boron, the region of P-type conductivity in electrical contact with the electrically conductive substrate, and means for electrically contacting the region of N-type conductivity.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE FIGURES

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF THE INVENTION

Figure 1:
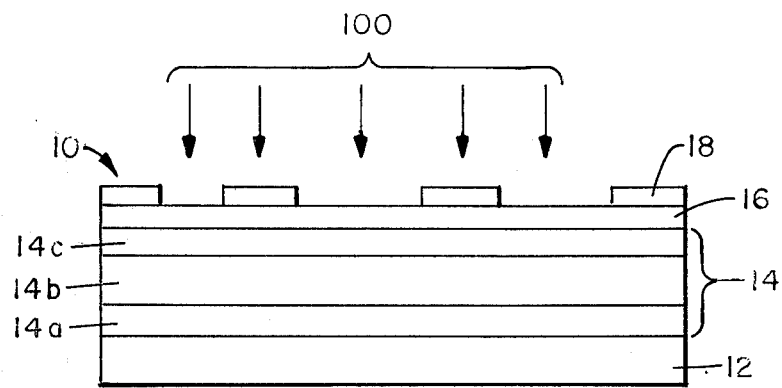
FIG. 1 illustrates an N-I-P hydrogenated amorphous silicon solar cell incorporating a compensated intrinsic region.

The invention may be more clearly illustrated by referring to FIG. 1 which depicts an N-I-P solar cell 10. Light such as solar radiation 100 impinging on solar cell 10, forms a reference point for the instant surface of each layer or region of the solar cell. The solar cell 10 includes an electrically conductive substrate 12 of aluminum, stainless steel, molybdenum, titanium or other suitable material. Optionally, the substrate 12 may be coated with an electrically conductive material such as a transparent conductive oxide, hereinreferred to as TCO, such as tin oxide, indium tin oxide or like material.

The active layer of hydrogenated amorphous silicon 14 is deposited on substrate 12 in a glow discharge. The active layer 14 has regions 14a, 14b and 14c of differing conductivity types. The region 14a, contiguous to and deposited on substrate 12 is doped P-type and may have a thickness in the range of from about 5 to 100 nanometers and preferably the P-type region is thin, such as about 7.5 nanometers.

The region 14b of compensated intrinsic hydrogenated amorphous silicon is contiguous to region 14a. The compensated intrinsic hydrogenated amorphous silicon region 14b is fabricated by a glow discharge with mono-atomic boron as a conductivity modifier in sufficient concentration to provide a neutral or substantially neutral space charge region under illumination, as will be explained. Using mono-atomic boron as a compensating dopant moves the Fermi level toward the valence band without the detrimental effects associated with other P-type dopants such as diborane. The compensated region 14b may have a thickness in the range of from about 300 nanometers to about 1,000 nanometers and preferably the intrinsic region is about 700 nanometers thick.

Region 14c is of N-type hydrogenated amorphous silicon preferably doped with phosphine or other suitable N-type dopants. The N-layer 14c has a thickness in the range of from about 10 to about 200 nanometers with a thickness of about 20 nanometers being preferred.

A transparent conductive oxide, TCO, is deposited on the active layer of hydrogenated amorphous silicon. The TCO layer 16 should be transparent to light, form an integral anti-reflection coating, and preferably have a resistivity of less than 500 ohms/square.

A grid electrode 18 is deposited on the TCO layer 16. The grid electrode 18 withdraws the current generated during the illumination of solar cell 10. The grid electrode 18 may be platinum, gold or other suitable material. If the area of the solar cell 10 decreases, the need for the grid electrode 18 diminishes and the TCO layer 16 may be sufficient to withdraw the current generated during illumination of the solar cell 10 without introducing excessive series resistance into the solar cell structure. As seen, the solar cell 10 has an active layer of hydrogenated amorphous silicon 14 having first and second major surfaces in electrical contact respectively with the substrate 12 and with the grid electrode 18.

The sample structures were deposited in a capacitively coupled RF glow discharge system operating at 13.56 MHz. Both electrodes, as is well known in the art, are of the same area and are made electrically equivalent by the use of an RF bridge circuit in the matching network. The deposition conditions were 3 watts RF power, 150 mtorr pressure, 150 sccm total flow rate and a 270° C. electrode temperature. Prior to each deposition, the chamber was heated to 80° C. while being evacuated to $10^{-6}$ Torr. The P-layer (7.5 nanometers in thickness) was deposited from a 1 atom percent diborane in silane mixture and the N-layer (40 nanometers in thickness) was deposited from a 1 atom percent phosphine in silane mixture. The intrinsic layer (700 nanometers in thickness) was deposited in the initial example, from a combination of 0.02 atom percent boron trifluoride in silane. For purposes of comparison, solar cells for illumination through the P-layer was made using the same gas mixtures and thicknesses for both the P and the N layers but in the case of the P-layer illuminated device the I-layer was deposited from pure silane as opposed to the mixture of silane and boron trifluoride. All structures were deposited on a glass coated with indium tin oxide, and evaporated aluminum formed the electrically conductive substrate or backing. As understood, the doping gas is pumped or flushed out of the system between the deposition of each type of layer. That is, the P-type layer is deposited first with the aforementioned diborane-silane mixture and after it is deposited the system is pumped out or otherwise flushed before the I-layer of the aforementioned boron trifluoride-silane-helium mixture is introduced. Thereafter the system is again flushed before the N-type region is deposited with the aforementioned phosphine-silane mixture. Additionally, prior to each deposition the vacuum chamber is baked from 3 to 4 hours at about 80° C. under vacuum.

Thermal conductivity activation energies ($E_A$) were measured in a small vacuum furnace. Dark conductivity and temperature data were obtained over the range of 150° C.–50° C. The optical gaps of the films were extrapolated using Tauc's formula, see J. Tauc in *Optical Properties of Solids*, edited by F. Abels (North-Holland, Amsterdam, 1970), P.303 and data from a Beckman, UV 5420 spectrophotometer. Photothermal spectra were obtained on several films and these measurements were used to determine qualitatively the doping effect on the density of states in the band tail region. The solar cells reported in Table 1 below were tested at AM 1 conditions.

TABLE 1

| Sample Number | Doping Level (Atom %) | $E_A$ (eV) | Optical Gap (eV) |
|---|---|---|---|
| 74 | undoped | 0.78 | 1.7 |
| 82 | 1% $B_2H_6/SiH_4$ | 0.35 | 1.4 |
| 63 | 0.02% $BF_3/SiH_4$ | 0.96 | 1.7 |
| 62 | 0.05% $BF_3/SiH_4$ | 0.88 | — |
| 136 | 0.4% $BF_3/SiH_4$ | 0.50 | 1.7 |
| 134 | 1% $BF_3/SiH_4$ | 0.40 | 1.7 |
| 138 | 3.5% $BF_3/SiH_4$ | 0.31 | 1.7 |

Wherein $E_A$ (eV) = Activation energy

Referring now to Table 1 the conductivity activation energies and optical band gaps are shown for intrinsic, $BF_3$-doped, and $B_2H_6$-doped amorphous silicon films. The data show that substitutional doping of amorphous silicon can advantageously be accomplished with $BF_3$, since the dark thermal conductivity activation energy varies from 0.31 eV to 0.96 eV when the gas phase $BF_3$ concentration is varied from 3.5 atom percent to 0.02 atom percent. However, $BF_3$ may be present in amounts in excess of 10 atom percent without experiencing the disadvantages of diborane doping. A critical point is that $BF_3$ doping does not change the optical gap of the material, see sample no. 74 and sample nos. 63, 62, 136, 134 and 138. Whereas, the optical gap of the diborane doped material significantly narrows, resulting in a smaller voltage output for the cell.

Figure 2:
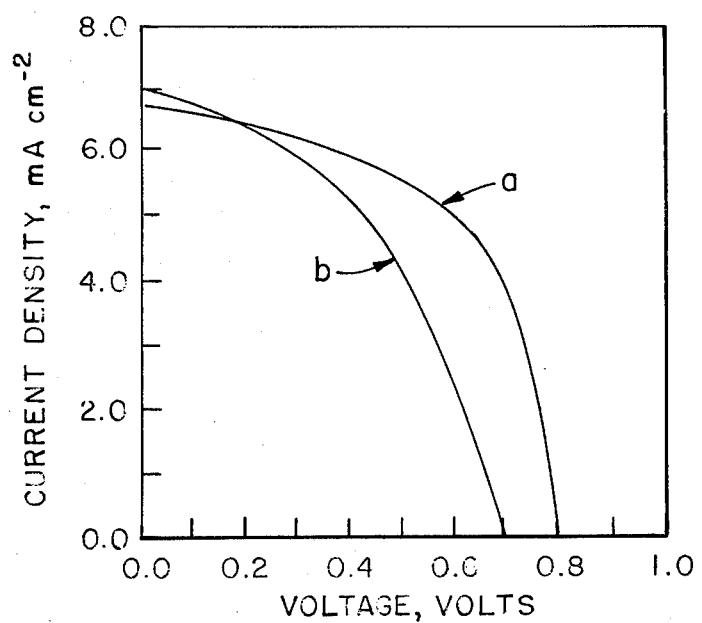
FIG. 2 is a graphical representation comparing voltage-current characteristics of two solar cells, one incorporating the invention.

The results of the solar cell measurements are shown in FIG. 2 wherein curve a shows an NIP cell with a $BF_3$ doped I-layer while curve b is for a PIN cell using an undoped I-layer. Table II below shows the improvement in efficiency, fill factor and open circuit voltage for the NIP solar cell with a boron trifluoride doped I-layer compared to the PIN solar cell with the efficiency, the fill factor and the open circuit voltage of the NIP cell being superior to the PIN cell.

TABLE II

| Illumination Through | η (%) | F.F. | $V_{oc}$ | $J_{sc}$ | Area (cm$^2$) |
|---|---|---|---|---|---|
| n-layer | 3.02 | .565 | .804 | 6.67 | 0.062 |
| p-layer | 2.10 | .425 | .701 | 7.03 | 0.066 |

η = efficiency
F.F. = Fill Factor
$V_{oc}$ = Open circuit voltage
$J_{sc}$ = Short circuit current (mA/cm$^2$)

The data show that BF$_3$ is an effective substitutional dopant in amorphous silicon films. Moreover, this doping behavior is free of the deleterious effects that accompany diborane doping. It is believed, but it is not certain, that the reasons for the difference in doping behavior between BF$_3$ and diborane are related to their different chemistry in the gas phase and at the surface of the growing film. For example, diborane decomposes thermally at temperatures slightly in excess of 100° C. while BF$_3$ does not. In a glow discharge, the primary reactions are ionization or excitation by electron bombardment followed by a complex ion-molecule reactions. Since BF$_3$ has an ionization potential of about 16 eV as compared to about 8 eV for diborane, the BF$_3$ will decompose to a lesser extent under a given set of plasma conditions. This is reflected in the data by the high concentration of BF$_3$ necessary to move the Fermi level to a 0.3 eV above the valence band. It is believed that the superior results obtained with the BF$_3$ doping is due to the mono-atomic nature of the boron trifluoride upon ionization, whereas the ionization of diborane at low energies leads almost exclusively to a bridged structure including two boron atoms and two hydrogen atoms, and for diborane, species containing more than one boron atom are highly unlikely to be electronically active substitutional dopants, see the Carlson patent wherein it is stated in column 4, lines 31–33 that only about 30 percent of the boron atoms are electronically active. This is not the case with BF$_3$.

The band gap narrowing caused by diborane doping which results in the lower voltage output of the cell is believed to be caused by high density of localized defect introduced in the band tails. These states show up clearly in the band tail region in optical absorption spectra obtained using photothermal deflection spectroscopy. For diborane doped films, these spectras show a much higher absorption than undoped amorphous silicon films and BF$_3$ doped films have a much lower absorption in the band tail regions than the diborane doped films.

The reasons for the increased solar cell efficiency reported in Table II for cells using a BF$_3$ doped I-layer in an N-I-P structure are not clear but three possibilities pertain. It is possible that the absorption of light in the first or N-layer of the N-I-P structure is lower due to its wider band gap, 1.7 eV as against 1.4 eV for the diborane-doped cell. Another factor could be a higher built-in potential at the N-I interface which would increase both the open circuit voltage and provide a higher barrier to back-diffusion of holes, thus improving the fill factor. Finally, it may be that the position of the Fermi level at mid gap in the BF$_3$ doped I-layer may allow a more uniform field throughout the device, thus aiding carrier collection in the I-layer. It should be noted that the fill factor and open circuit voltage illustrated in both Table II and FIG. 2 are notably improved in the N-I-P device with only a slight degradation in the short circuit current, on the order of about 5 percent.

Accordingly, all the advantages inherent in using the N-layer as the illuminated layer have been attained by modifying the I-layer without degrading its transport or absorption properties. While BF$_3$ has been used for illustrative purposes only, it will be understood that other gases wherein boron is present in the mono-atomic form may be substituted without losing the advantages of the present invention. For instance, a silicon trichloride-boron difluoride molecule may be substituted without encountering the serious defects inherent in diborane doping. To the extent that substituted boron halides are available that will fit into the silicon lattice they may be substituted for the boron trifluoride described herein.

While there has been described herein what is considered at the present time to be the preferred embodiment of the present invention, it will be understood that various modification and alterations may be made without departing from the true scope of the invention and it is intended to cover in the claims appended hereto all such modifications and alterations.

The embodiments of the invention in which an exclusive property or privilege is claimed are defined as follows:

1. In an amorphous silicon solar cell which comprises an electrically conductive substrate, a layer of glow discharge deposited hydrogenated amorphous silicon over said substrate and having regions of differing conductivity with at least one region of intrinsic hydrogenated amorphous silicon, said layer of hydrogenated amorphous silicon having opposed first and second major surfaces where said first major surface contacts said electrically conductive substrate, and means for electrically contacting said second major surface, the improvement wherein the intrinsic hydrogenated amorphous silicon region is deposited from an atmosphere containing not less than about 0.2 atom percent mono-atomic boron.

2. The solar cell of claim 1, wherein said mono-atomic boron is present as a boron halide.

3. The solar cell of claim 1, wherein said mono-atomic boron is present as a boron fluoride-containing compound.

4. The solar cell of claim 1, wherein said boron is present as boron trifluoride.

5. The solar cell of claim 1, wherein the mono-atomic boron is present in an amount of from about 0.02 atom percent to about 10 atom percent.

6. The solar cell of claim 1, wherein the mono-atomic boron is present in the range of from about 0.02 atom percent to about 3.5 atom percent.

7. The solar cell of claim 1, wherein the intrinsic hydrogenated amorphous silicon layer has a thickness in the range of from about 300 to about 1,000 nanometers.

8. The solar cell of claim 1, wherein the intrinsic hydrogenated amorphous silicon layer has a thickness of about 700 nanometers.

9. An amorphous silicon solar cell comprising an electrically conductive substrate, a layer of glow discharge deposited hydrogenated amorphous silicon over said substrate and having regions of N-type conductivity and P-type conductivity separated by a region of intrinsic hydrogenated amorphous silicon deposited from an atmosphere containing not less than about 0.02 atom percent mono-atomic boron, said region of P-type conductivity being in electrical contact with said electrically conductive substrate, and means for electrically contacting said region of N-type conductivity.

10. The solar cell of claim 9, wherein said monoatomic boron is present as a boron halide.

11. The solar cell of claim 9, wherein said monoatomic boron is present as a boron fluoride containing compound.

12. The solar cell of claim 9, wherein said boron is present as boron trifluoride.

13. The solar cell of claim 9, wherein the monoatomic boron is present in an amount of from about 0.02 atom percent to about 10 atom percent.

14. The solar cell of claim 9, wherein the monoatomic boron is present in the range of from about 0.02 atom percent to about 3.5 atom percent.

15. The solar cell of claim 9, wherein the intrinsic hydrogenated amorphous silicon layer has a thickness in the range of from about 300 to about 1,000 nanometers.

16. The solar cell of claim 9, wherein the intrinsic hydrogenated amorphous silicon layer has a thickness of about 700 nanometers.

17. The solar cell of claim 9, wherein said N-type region has a thickness in the range of from about 10 to about 200 nanometers.

18. The solar cell of claim 9, wherein the N-type region has a thickness of about 20 nanometers.

19. The solar cell of claim 9, wherein the P-type region has a thickness in the range of from about 5 to about 100 nanometers.

20. The solar cell of claim 9, wherein the P-type region has a thickness of about 7.5 nanometers.

21. The solar cell of claim 9, wherein the said electrically conductive substrate is aluminum.

* * * * *

UNITED STATES PATENT AND TRADEMARK OFFICE
CERTIFICATE OF CORRECTION

PATENT NO. : 4,409,424

DATED : October 11, 1983

INVENTOR(S) : Genevieve Devaud

It is certified that error appears in the above-identified patent and that said Letters Patent is hereby corrected as shown below:

Column 6, line 38, "0.2" should read --0.02--.

Signed and Sealed this

Nineteenth Day of November, 1991

Attest:

HARRY F. MANBECK, JR.

*Attesting Officer* — *Commissioner of Patents and Trademarks*